US010622422B2

(12) United States Patent
Liu et al.

(10) Patent No.: US 10,622,422 B2
(45) Date of Patent: Apr. 14, 2020

(54) DISPLAY PANEL, MANUFACTURING METHOD THEREOF AND DISPLAY DEVICE

(71) Applicant: Wuhan China Star Optoelectronics Semiconductor Display Technology Co., Ltd., Wuhan, Hubei (CN)

(72) Inventors: Changyu Liu, Guangdong (CN); Peng Li, Guangdong (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/125,196

(22) Filed: Sep. 7, 2018

(65) Prior Publication Data

US 2019/0280060 A1 Sep. 12, 2019

Related U.S. Application Data

(63) Continuation of application No. PCT/CN2018/089050, filed on May 30, 2018.

(30) Foreign Application Priority Data

Mar. 9, 2018 (CN) .......................... 2018 1 0193576

(51) Int. Cl.
*H01L 27/32* (2006.01)
*H01L 51/56* (2006.01)
*H01L 51/52* (2006.01)

(52) U.S. Cl.
CPC ...... *H01L 27/3246* (2013.01); *H01L 51/5206* (2013.01); *H01L 51/5256* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 2012/0175617 | A1* | 7/2012 | Kim | .................... | H01L 27/3246 257/59 |
| 2017/0110532 | A1* | 4/2017 | Kim | .................... | H01L 51/0017 |
| 2019/0296262 | A1* | 9/2019 | Lee | .................... | H01L 51/5275 |

FOREIGN PATENT DOCUMENTS

| CN | 106409869 A | 2/2017 |
| CN | 106450038 A | 2/2017 |
| CN | 107046105 A | 8/2017 |

OTHER PUBLICATIONS

International search report dated Nov. 15, 2018 from corresponding application No. PCT/CN2018/089050.

* cited by examiner

*Primary Examiner* — Reema Patel
*Assistant Examiner* — Steven M Christopher
(74) *Attorney, Agent, or Firm* — Leong C. Lei

(57) ABSTRACT

Provided is a display panel, comprising: a substrate, and a planarization layer, an anode layer, a pixel definition layer, a cathode layer and an encapsulation layer sequentially stacked on the substrate; wherein in an edge area of the display panel, the pixel definition layer comprises a retaining wall group on the anode layer, comprising sub-retaining walls which are spaced apart, and the retaining wall group comprises a first side close to a display area and a second side away therefrom, wherein spaces of the sub-retaining walls form a path with a length greater than a straight line distance from the first side to the second side. The diffusion rate and diffusion range of the organic layer are controlled by performing anode hole optimization to form staggered sub-retaining walls, thereby reducing a number of edge (Continued)

retaining walls and reducing the edge area to increase a screen occupation ratio.

18 Claims, 5 Drawing Sheets

DISPLAY PANEL, MANUFACTURING METHOD THEREOF AND DISPLAY DEVICE

CROSS-REFERENCE TO RELATED APPLICATION

This application is a continuing application of PcT Patent Application No. PCT/CN2018/089050 entitled "Display panel, manufacturing method thereof and display device", filed on May 30, 2018, which claims priority to Chinese Patent Application No. 201810193576.2, filed on Mar. 9, 2018, both of which are hereby incorporated in its entireties by reference.

FIELD OF THE INVENTION

The present invention relates to a display field, and more particularly to a display panel, a manufacturing method thereof and a display device.

BACKGROUND OF THE INVENTION

In the current field of illumination and display, the Active Matrix Light-Emitting Diode (AMOLED) has fast response, high color gamut, high contrast, wide viewing angle, low power consumption, foldability, simple structure and self-illumination, and is more and more widely used in the development of lighting products and panel industry, which is regarded as one of the most promising products.

Since OLED devices are extremely sensitive to moisture and oxygen, plasma-enhanced chemical vapor deposition (PECVD) and inkjet printing (UP) are widely used to alternately deposit polymer organic films and inorganic films on the surface of the OLED to form a multilayer film encapsulation (TFE) structure, in which the organic layer and the inorganic layer are alternately arranged to prevent oxidation of the OLED by moisture and oxygen. However, due to the flow of the organic layer material on the surface of the OLED, it is often necessary to design a first retaining wall (Dam) and a second retaining wall on the planarization layer of the edge area of the display panel to control the diffusion range of Ink as shown in FIG. 1. However, the presence of the first retaining wall and the second retaining wall increases the width of the non-display area in the display panel, thus reducing the screen occupation ratio of the display panel.

SUMMARY OF THE INVENTION

An objective of the present invention is to provide a display panel, which can control the diffusion rate and diffusion range of an organic layer for reducing an edge area of the display panel to increase a screen occupation ratio.

Further provided are a manufacturing method of a display panel and a display device.

The display panel of the present invention comprises a substrate, and a planarization layer, an anode layer, a pixel definition layer, a cathode layer and an encapsulation layer sequentially stacked on the substrate; wherein outside a display area of the display panel, the pixel definition layer comprises a retaining wall group disposed on the anode layer, and the retaining wall group comprises a plurality of sub-retaining walls which are spaced apart, and the retaining wall group comprises a first side close to the display area of the display panel and a second side away from the display area of the display panel, wherein spaces of the plurality of the sub-retaining walls, which are spaced apart, form a path, and a length of the path is greater than a straight line distance from the first side to the second side.

The sub-retaining walls are protrusions disposed on the anode layer, and a height of the protrusions is 5 μm to 15 μm.

The anode layer is provided with a plurality of anode holes penetrating through the anode layer, and the sub-retaining walls are correspondingly disposed in the anode holes and protrude from the anode layer, and the sub-retaining walls pass through the anode layer and are connected with the planarization layer and the cathode layer.

The sub-retaining walls comprise first sub-retaining walls and second sub-retaining walls, and the first sub-retaining walls are arranged at intervals along an extending direction perpendicular to a direction from the first side to the second side, and an interval between two first sub-retaining walls is a first space, and the second sub-retaining walls are arranged at intervals along the extending direction perpendicular to the direction from the first side to the second side, and one of the second sub-retaining walls is arranged corresponding to the interval between the two first sub-retaining walls, and a width of the sub-retaining walls is greater than or equal to a width of the first space.

The sub-retaining walls further comprise at least one third sub-retaining wall disposed close to the second side, and the third sub-retaining wall has a width greater than a sum of a width of the first sub-retaining wall and a width of the second sub-retaining wall.

The pixel definition layer comprises an edge retaining wall on a side of the retaining wall group away from the display area of the display panel, and the edge retaining wall is spaced apart from the retaining wall group.

A spacer layer is stacked on the pixel definition layer, and each of the sub-retaining walls comprises a first portion and a second portion stacked on the first portion, and the first portion is disposed in a same layer as the pixel definition layer, and the second portion is disposed in a same layer as the spacer layer.

The manufacturing method of the display panel for manufacturing the aforesaid display panel, comprises:

forming a planarization layer on a substrate;

forming an anode layer on the substrate and the planarization layer;

forming a pixel definition layer on the anode layer and the planarization layer, wherein the pixel definition layer outside a display area of the display panel comprises a retaining wall group, and the retaining wall group comprises a plurality of sub-retaining walls which are spaced apart, and the retaining wall group comprises a first side close to the display area of the display panel and a second side away from the display area, wherein spaces of the plurality of the sub-retaining walls, which are spaced apart, form a path, and a length of the path is greater than a straight line distance from the first side to the second side;

forming a cathode layer on the pixel definition layer and the retaining wall group;

forming an encapsulation layer on the cathode layer.

Forming the anode layer on the substrate and the planarization layer comprises:

coating a metal layer on the substrate and the planarization layer, and patterning the metal layer to form the anode layer, and forming anode holes penetrating through the anode layer and being spaced apart outside the display area of the display panel;

forming the pixel definition layer on the anode layer and the planarization layer, wherein the pixel definition layer outside a display area of the display panel comprises a retaining wall group, and the retaining wall group comprises a plurality of sub-retaining walls which are spaced apart, comprises:

coating a pixel material layer on the anode layer and the planarization layer, and patterning the pixel material layer to form a pixel definition layer, wherein the pixel material layer outside the display area of the display panel is patterned to form the retaining wall group, and the sub-retaining walls of the retaining wall group are correspondingly disposed in the anode holes and protrude from the anode layer.

The display device of the present invention comprises the aforesaid display panel.

In the display panel, the diffusion rate and diffusion range of the organic layer in the encapsulation layer are controlled by performing anode hole optimization in the anode layer to form staggered sub-retaining walls, thereby reducing a number of edge retaining walls of the display panel and reducing an edge area of the display panel to increase a screen occupation ratio.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 2:
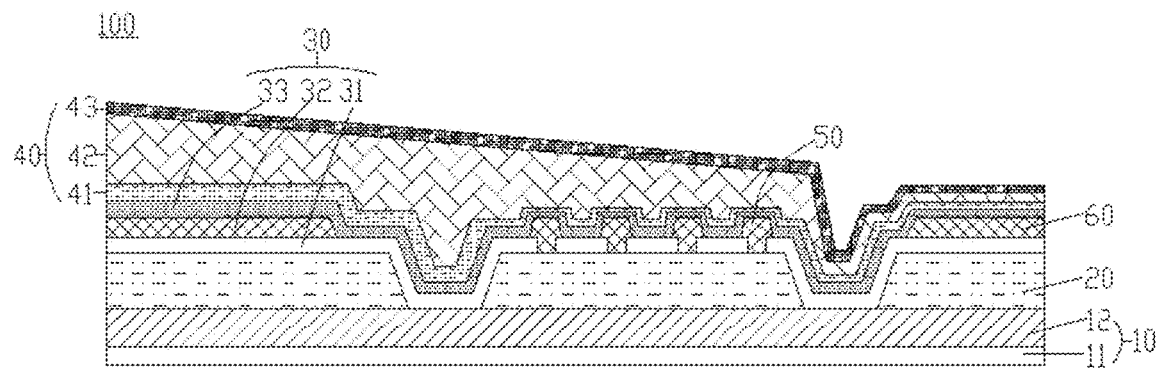
FIG. 2 is a sectional diagram of a display panel according to the present invention.
Figure 3:
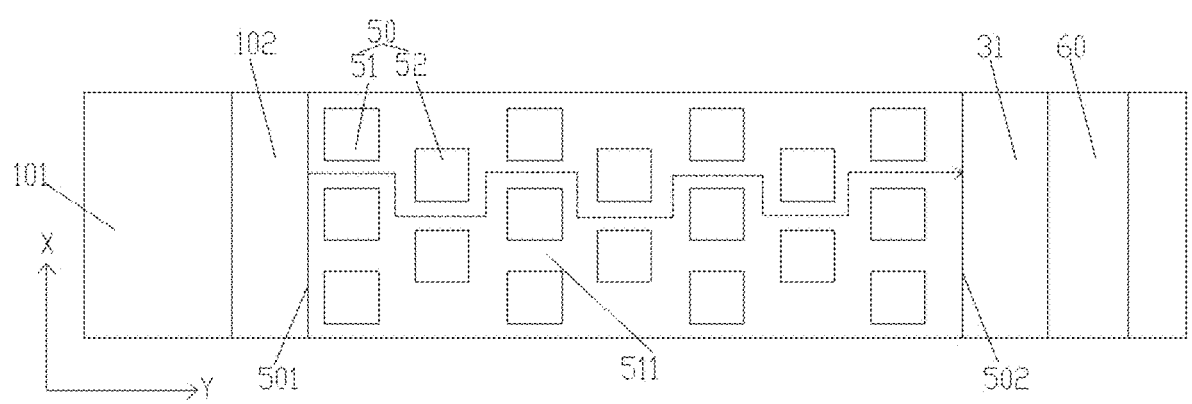
FIG. 3 is a plan view structural diagram of the first embodiment of the display panel shown in FIG. 2.

Please refer to FIG. 2 and FIG. 3. The present invention provides a display panel. The display panel is an AMOLED (Active Matrix Organic Light Emitting Diode). The display panel 100 comprises a display area 101 and an edge area 102, and the edge area 102 refers to an area outside the display area 102 of the display panel 100. The display panel 100 comprises a substrate 10, and a planarization layer 20, an anode layer 31, a pixel definition layer 32, a cathode layer 33 and an encapsulation layer 40 which are sequentially stacked on the substrate 10. Outside a display area 101 of the display panel 100, the pixel definition layer 32 comprises a retaining wall group disposed on the anode layer 31, and the retaining wall group comprises a plurality of sub-retaining walls 50 which are spaced apart, and the retaining wall group comprises a first side 501 close to the display area 101 of the display panel 100 and a second side 502 away from the display area 101 of the display panel 100, wherein spaces of the plurality of the sub-retaining walls 50, which are spaced apart, form a path, and a length of the path is greater than a straight line distance from the first side 501 to the second side 502 to extend a flow path of organic material to the edge region 102 during encapsulation, thereby effectively controlling the diffusion rate and diffusion range of the organic material. The substrate 10 comprises a flexible substrate 11 made of PI (Polyimide) and a thin film transistor layer 12 laminated on the flexible substrate 11. The first side 501 and the second side 502 of the retaining wall group are opposite and parallel, and both are perpendicular to an extending direction from the display area 101 to the edge area 102. The path formed by the plurality of sub-retaining walls 50 does not include a linear distance from the first side 501 to the second side 502.

On the planarization layer outside the display area of the display panel of the present invention, a plurality of sub-retaining walls arranged in a staggered arrangement are formed. The spaces of the plurality of sub-retaining walls form a path. When the display panel is encapsulated, and the organic material in the encapsulation layer diffuses from the display area to the edge area, the organic material diffuses along the path formed by the spaces of the sub-retaining walls. The length of the flow path of the organic layer in the display panel of the present invention is increased compared to the linear diffusion of the organic layer in the conventional display panel. The diffusion rate and the diffusion range of the organic layer can be effectively controlled to reduce the amount of organic material diffused to the outermost side of the edge area, and to reduce the number of the retaining walls for retaining the organic material in the edge area, thereby reducing the edge area of the display panel and increasing the screen occupation ratio of the display panel.

In the present invention, the encapsulation layer 40 comprises a first inorganic layer 41, an organic layer 42 covering the first inorganic layer 41 and a second inorganic layer 43 on the organic layer 42. Generally, the encapsulation layer is formed by alternately stacking an inorganic layer, an organic layer and an inorganic layer, and may be stacking 3 or 5 layers. The inorganic layer is a combination of SiOx, SiNx or other inorganic materials. The organic layer is formed by uniformly coating a molten material (hereinafter referred to as Ink), which can block moisture between two inorganic layers by an IJP (Inject Printer) technology, and can flatten the surface of the display panel and increase the bendability of the display panel. The encapsulation layer 40 is stacked on the cathode layer 33 for encapsulating the display panel to prevent the display panel from being attacked by moisture and oxygen.

Figure 4:
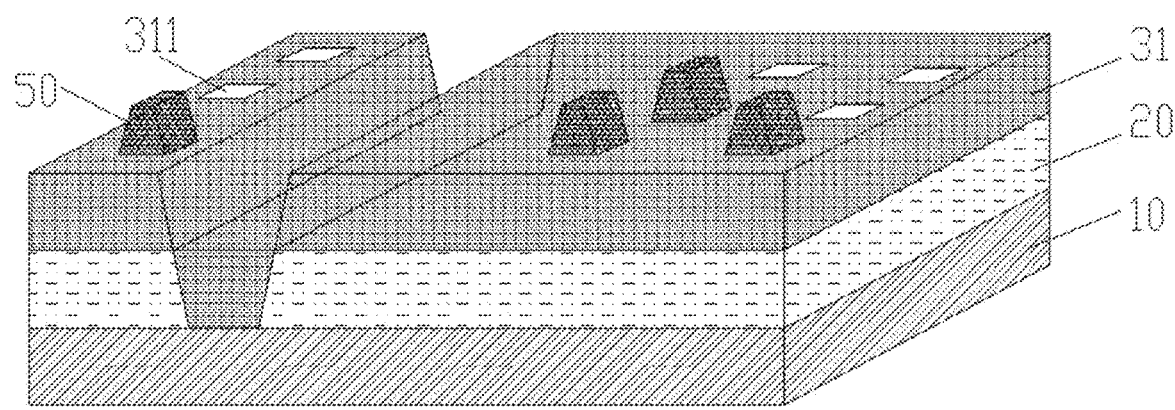
FIG. 4 is a partial structural diagram of the display panel shown in FIG. 2.
Figure 5:
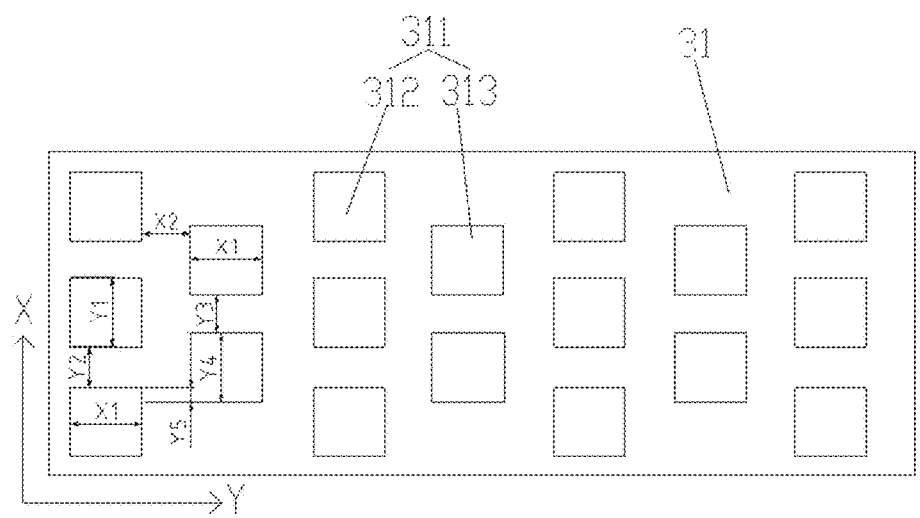
FIG. 5 is a distribution structure diagram of anode holes outside the display area of the display panel in FIG. 2.

Please refer to FIG. 4, together. The sub-retaining walls 50 are protrusions disposed on the anode layer 31, and a height of the protrusions is 5 μm to 15 μm for controlling the diffusion rate and diffusion range of Ink. The sub-retaining walls 50 comprise first sub-retaining walls 51 and second sub-retaining walls 52. The first sub-retaining walls 51 are arranged at intervals along an extending direction perpendicular to a direction from the first side 501 to the second side 502, and an interval between two first sub-retaining walls 51 is a first space 511, and the second sub-retaining walls 52 are arranged at intervals along the extending direction perpendicular to the direction from the first side 501 to the second side 502, and one of the second sub-retaining walls 52 is arranged corresponding to the interval between the two first sub-retaining walls 51, and a width of the sub-retaining walls 52 is greater than or equal to a width of the first space 511. Specifically, in a direction perpendicular to the direction from the first side 501 to the second side 502, the plurality of first sub-retaining walls 51 forms a plurality of first sub-retaining wall groups, and the plurality of the second sub-retaining walls 52 forms a plurality of second sub-retaining wall groups; along the extending direction from the first side 501 to the second side 502, the plurality of first sub-retaining wall groups and the plurality of second sub-retaining wall groups are spaced apart.

Please refer to FIG, together. The anode layer 31 is provided with a plurality of anode holes 311 penetrating through the anode layer 31, and the sub-retaining walls 50 are correspondingly disposed in the anode holes 311 and protrudes from the anode layer 31, and the sub-retaining walls 50 pass through the anode layer 31 and are connected with the planarization layer 20 and the cathode layer 33. Outside the display area 101 of the display panel 100, the anode holes 311 include first anode holes 312 and second anode holes 313. A plurality of the first anode holes 312 are arranged at intervals along the Y-axis direction in the figure. One of the second anode holes 313 is arranged corresponding to the space 3121 between the two first anode holes 312, and a width of the second anode holes 313 is greater than or equal to a width of the space 3122. In the present invention, in the Y-axis direction, a width of the first anode hole 312 and the second anode hole 313 is defined as X1, and a width of the space between the first anode hole 312 and the second anode hole 313 is defined as X2; in the X-axis direction, a width of the first anode hole 312 is defined as Y1, and a width of the space between the adjacent two first anode holes 312 is defined as Y2, and the space between the adjacent two second anode holes 313 is defined as Y3, and a width of the second anode hole 313 is defined as Y4, and a misalignment width of the first anode hole 312 and the second anode hole 313 along the X-axis direction is defined as Y5, wherein Y2=αY1, Y3=βY4, Y5=γY4, X2=δX1, and α, β, γ, δ=0.1 to 0.3, then Y2<Y4, Y3<Y1, Y2+2Y1=Y4+2(Y3+Y5), and Y4=[(2β+2γ+1)/(α+2)]Y1 can be derived, and thus, the values of the two hole density coefficients of the anode holes 311 in the anode layer 31 in the present invention can be determined as Y2/(Y1+Y2) and Y3/(Y4+Y3), respectively.

Figure 1:
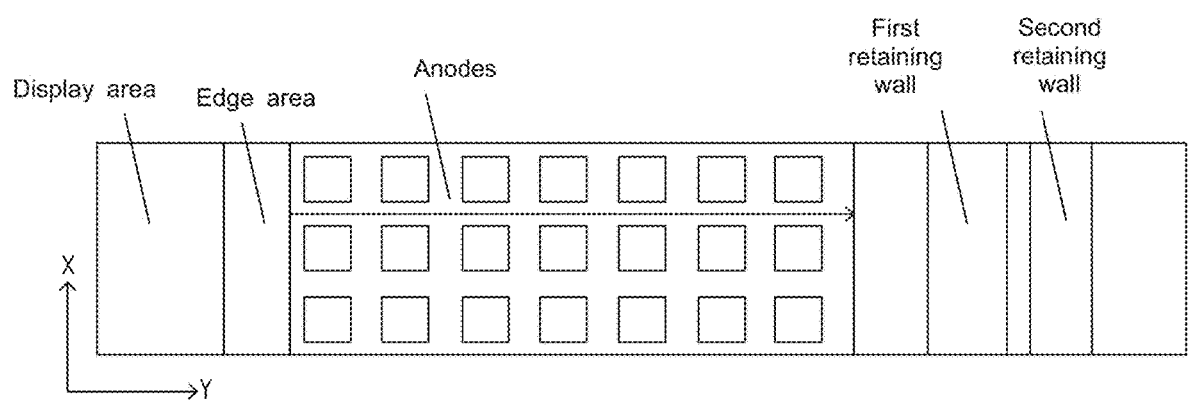
FIG. 1 is a plan view structural diagram of a conventional display panel outside a display area.

Specifically, the sub-retaining walls 50 have a one-to-one correspondence with the anode holes 311. The first sub-retaining wall 51 is located in the first anode hole 312, and the second sub-retaining wall 52 is located in the second anode hole 313. When the size of the anode hole 311 changes, the size of the sub-retaining wall 50 also changes accordingly, and the paths formed by the spaces of the plurality of spaced sub-retaining walls 50 are different, and the degree of control over the diffusion rate and the diffusion range of the organic material will also be different. Please refer to FIG. 3, again. In the first embodiment of the present invention, the first sub-retaining wall 51 and the second sub-retaining wall 52 have the same size, that is, the first anode hole 312 and the second anode hole 313 have the same size. As shown in FIG. 3, Ink flows from a first space 511 between two first sub-retaining walls 51 of a first sub-retaining wall group to a space between two second sub-retaining walls 52 of a second sub-retaining wall group, and then Ink flows to a first space 511 of another first sub-retaining wall group. In comparison with FIG. 1, the diffusion path of Ink increases significantly, and as Ink diffuses from the first side 501 to the second side 502, the diffusion rate of Ink gradually decreases. Outside the display area 101 of the display panel 100, the pixel definition layer 32 comprises an edge retaining wall 60 on a side of the retaining wall group away from the display area 101 of the display panel 100, and the edge retaining wall 60 is spaced apart from the retaining wall group to restrict the diffusion range of the Ink flowing out of the retaining wall group and to reduce the number of retaining walls at the edge of the conventional display panel, thereby reducing the edge area 102 and increasing the screen occupation ratio. The edge retaining wall 60 passes through the anode layer 31 and is connected with the planarization layer 20 and the encapsulation layer 40. In the present embodiment, a diffusion path of Ink in the Y-axis direction in the retaining wall group is indicated by a broken line in FIG. 3.

Figure 6:
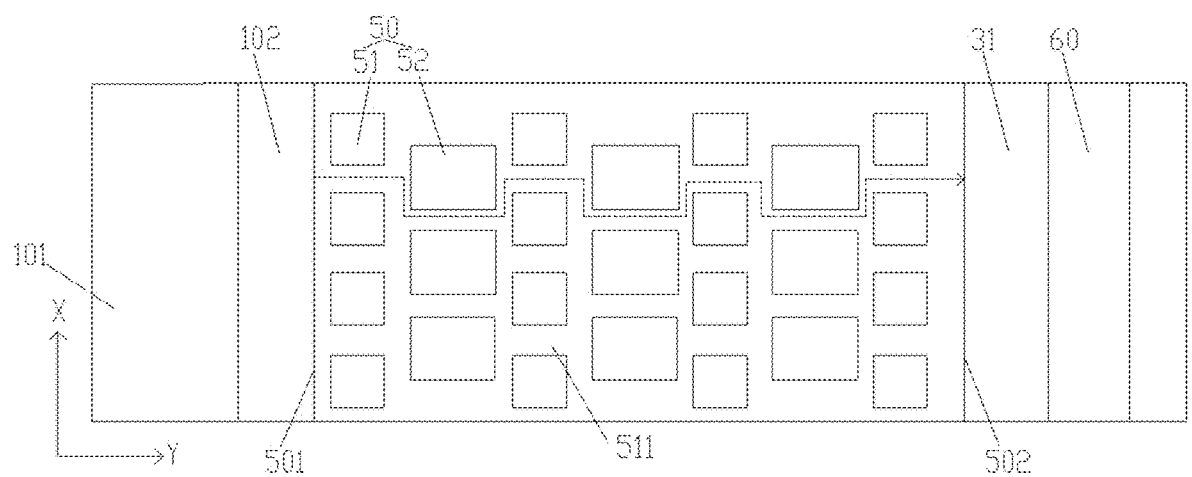
FIG. 6 is a plan view structural diagram of the second embodiment of the display panel shown in FIG. 2.

As shown in FIG. 6, in the second embodiment of the present invention, the difference from the first embodiment is that the size of the first sub-retaining wall 51 is smaller than the size of the second sub-retaining wall 52, that is, the size of the first anode hole 312 is smaller than the size of the second anode hole 313. Similarly, Ink flows in the path formed by the sub-retaining walls 50 which are disposed at intervals. Compared with FIG. 1, the diffusion path of Ink is significantly increased, and the diffusion rate of the organic layer 42 can be effectively controlled. Outside the display area 101 of the display panel 100, the edge retaining wall 60 of the pixel definition layer 32 on the side of the retaining wall group away from the display area 101 of the display panel 100 restricts the diffusion range of the Ink flowing out of the retaining wall group and to reduce the number of retaining walls at the edge of the conventional display panel, thereby reducing the edge area 102 and increasing the screen occupation ratio. In the present embodiment, a diffusion path of Ink in the Y-axis direction in the retaining wall group is indicated by a broken line in FIG. 6.

In other embodiments of the present invention, the difference from the aforesaid two embodiments is that the sub-retaining walls 50 comprise at least one third sub-retaining wall 53, and the third sub-retaining wall 53 passes through the anode layer 31, and is connected with the planarization layer 20 and the cathode layer 33, and is perpendicular to the extending direction from the first side 501 to the second side, and a width of the third sub-retaining wall 53 is greater than the width of the first sub-retaining wall 51 and the width of the second sub-retaining wall 52. Namely, the anode holes 311 comprise at least one third anode hole, and in the X-axis direction, the width of the third anode hole is larger than the width of the first anode hole 312 and the width of the second anode hole 313.

Figure 7:
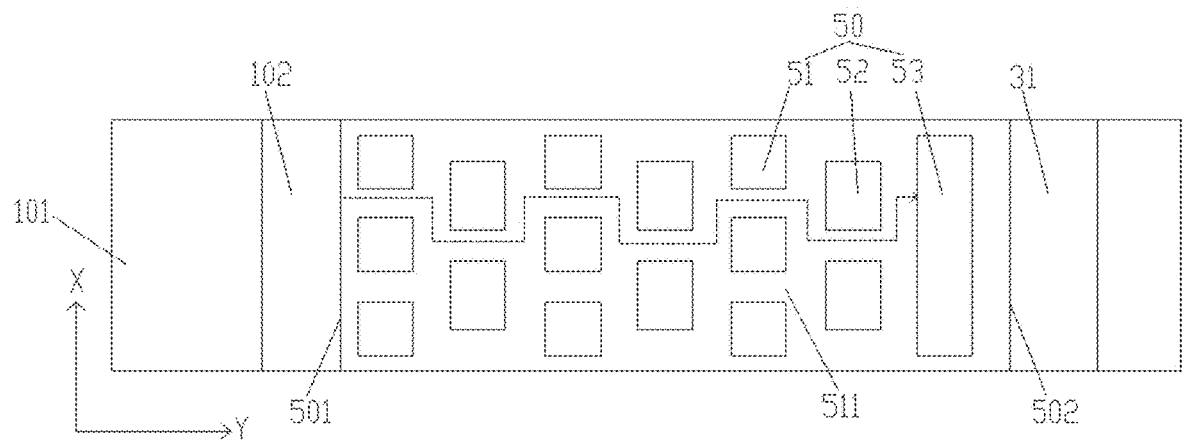
FIG. 7 is a plan view structural diagram of the third embodiment of the display panel shown in FIG. 2.

As shown in FIG. 7, in the third embodiment of the present invention, the sub-retaining walls 50 include a third sub-retaining wall 53. The third sub-retaining wall 53 is an entire retaining wall that completely retains ink flowing out of the first sub-retaining walls 51 and the second sub-retaining walls 52. The edge retaining wall in the edge area of the conventional display panel is completely eliminated for greatly reducing the size of the edge area 102, and further increasing the screen occupation ratio. In the present embodiment, a diffusion path of Ink in the Y-axis direction in the retaining wall group is indicated by a broken line in FIG. 7.

Figure 8:
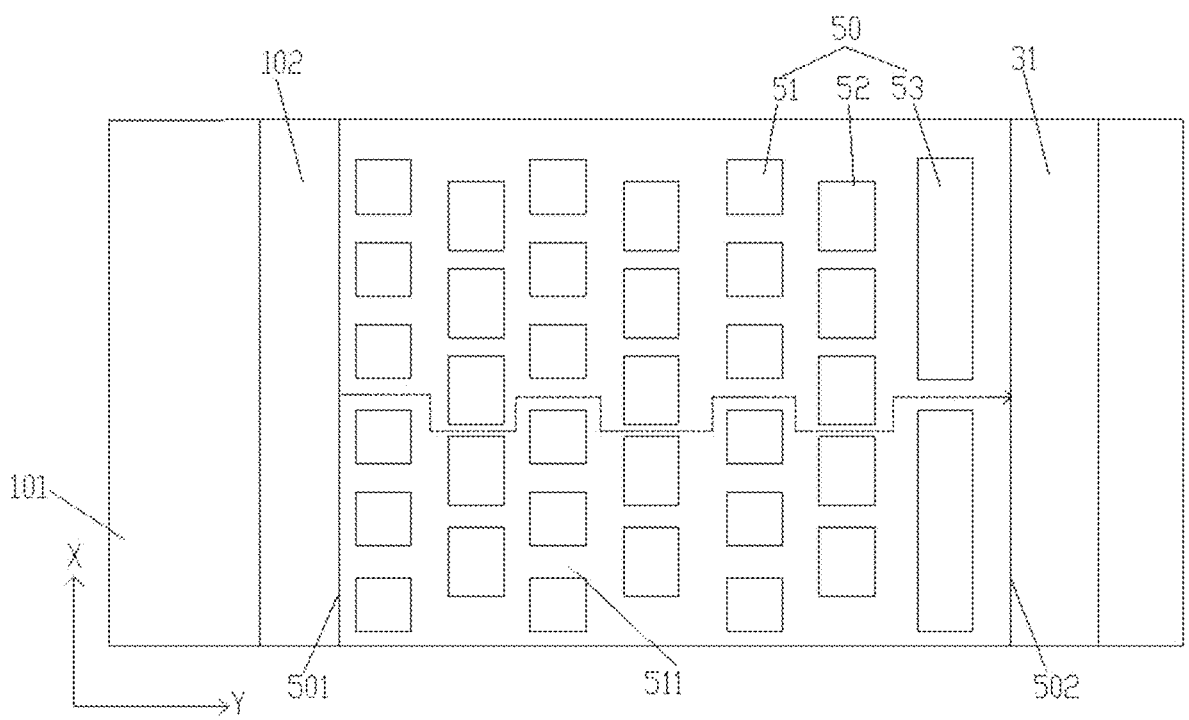
FIG. 8 is a plan view structural diagram of the fourth embodiment of the display panel shown in FIG. 2.

As shown in FIG. 8, in the fourth embodiment of the present invention, the sub-retaining walls 50 include a plurality of third sub-retaining walls 53. In a direction perpendicular to the direction from the first side 501 to the second side 502, the plurality of the third sub-retaining walls 53 are spaced apart at interval, and a width of each of the third sub-retaining walls 53 is equal to a sum of a width of three of the first sub-retaining walls 51 and a width of two of the first spacers 511. The arrangement of the plurality of the third sub-retaining walls 53 further retains the Ink flowing out from the first sub-retaining wall 51 and the second sub-retaining wall 52, so that the flow path of Ink is further increased, which is more advantageous for controlling the diffusion rate and the diffusion range of Ink. Meanwhile, the arrangement of the plurality of the third sub-retaining walls is advantageous for improving the display flexibility of the display panel and reducing the bending radius of the display panel.

Specifically, each of the sub-retaining walls 50 in the retaining wall group is formed in the same process with the pixel definition layer 32. It can be understood that a spacer layer is further stacked on the pixel definition layer 32, and each of the sub-retaining walls comprises a first portion and a second portion stacked on the first portion, and the first portion is disposed in the same process with the pixel definition layer 32, and the second portion is disposed in the same process with the spacer layer. Forming each of the sub-retaining walls while forming the pixel definition layer and/or the spacer layer saves the manufacturing cost of the display panel and improves the competitiveness of the product.

Figure 9:
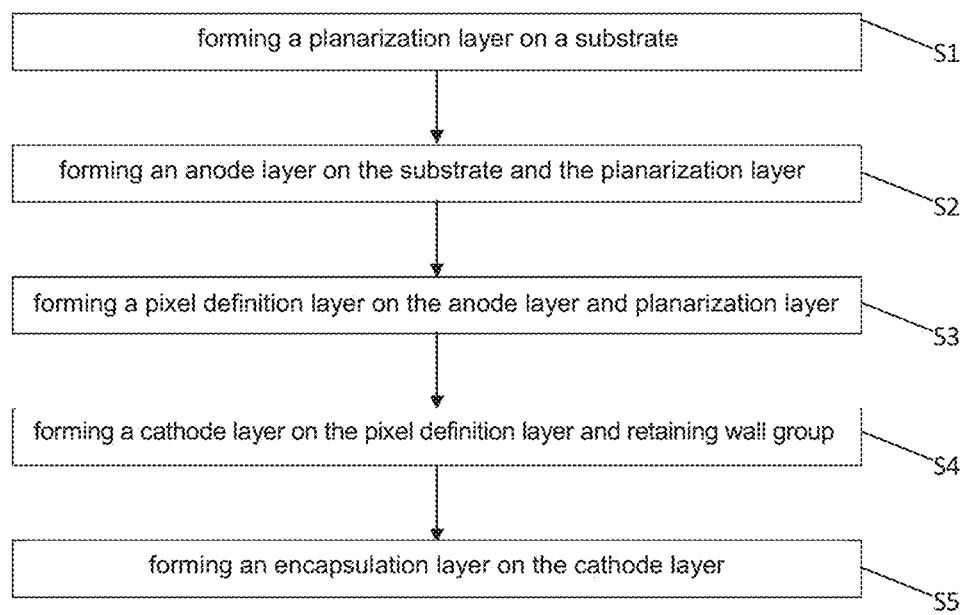
FIG. 9 is a flowchart of a manufacturing method of a display panel according to the present invention.

As shown in FIG. 9, the present invention further provides a manufacturing method of a display panel for manufacturing the aforesaid panel, comprises:

Step S1, forming a planarization layer 20 on a substrate 10. The substrate 10 comprises a flexible substrate 11 made of PI (Polyimide) and a thin film transistor layer 12 laminated on the flexible substrate 11.

Step S2, forming an anode layer 31 on the substrate 10 and the planarization layer 20. The step specifically comprises: coating a metal layer on the substrate 10 and the planarization layer 20, and patterning the metal layer to form the anode layer 31, and forming anode holes 311 penetrating through the anode layer 31 and being spaced apart outside the display area 101 of the display panel 100. The patterning process includes coating, photomasking, etching and development.

Step S3, forming a pixel definition layer 32 on the anode layer 31 and the planarization layer 20. The pixel definition layer 32 outside a display area 101 of the display panel 100 comprises a retaining wall group, and the retaining wall group comprises a plurality of sub-retaining walls 50 which are spaced apart, and the retaining wall group comprises a first side 501 close to the display area 101 of the display panel 100 and a second side 502 away from the display area 101, wherein spaces of the plurality of the sub-retaining walls 50, which are spaced apart, form a path, and a length of the path is greater than a straight line distance from the first side 501 to the second side 502. Specifically, the aforesaid step comprises: coating a pixel material layer on the anode layer 31 and the planarization layer 20, and patterning the pixel material layer to form a pixel definition layer 32, wherein the pixel material layer outside the display area 101 of the display panel 100 is patterned to form the retaining wall group, and the sub-retaining walls 50 of the retaining wall group are correspondingly disposed in the anode holes 311 and protrude from the anode layer 31.

Step S4, forming a cathode layer 33 on the pixel definition layer 32 and the retaining wall group. Specifically, a metal layer is coated on the surface of the pixel definition layer 32 and each of the sub-retaining walls 50 to form a cathode layer 33.

Step S5, forming an encapsulation layer 40 on the cathode layer 33. In the present embodiment, the encapsulation layer 40 comprises a first inorganic layer 41, an organic layer 42 covering the first inorganic layer 41 and a second inorganic layer 43 on the organic layer 42. The encapsulation layer 40 is stacked on the cathode layer 33 for encapsulating the display panel to prevent the display panel from being attacked by moisture and oxygen.

The present invention further provides a manufacturing method of a display panel, which is different from the foregoing manufacturing method of the display panel, the step of forming the pixel definition layer 32 on the anode layer 31 and the planarization layer 20 specifically comprises: coating a pixel material layer on the anode layer 31 and the planarization layer 20, and patterning the pixel material layer to form a pixel definition layer 32 and a first portion of each of the sub-retaining walls 50 located within each of the anode holes 311, and then coating a barrier material layer on the pixel definition layer 32 and the first portion of each of the sub-retaining walls 50, and patterning the barrier material layer to form a barrier layer and a second portion of each of the sub-retaining walls 50 stacked on the first portion of each of the sub-retaining walls 50. With this method, each of the sub-retaining walls 50 is formed while forming the pixel definition layer 31 and the barrier layer, without adding an additional process and without increasing the manufacturing cost. The pixel material layer 32 and the barrier material layer are patterned to form the first portion and the second portion of each of the sub-retaining walls 50 by etching.

The present invention further provides a display device, comprising the aforesaid display panel.

In the manufacturing method of the display panel according to the present invention, by forming anode holes in the anode layer in the edge area and optimizing the sizes, positions and densities of the anode holes, the diffusion rate and diffusion range of the organic layer material in the encapsulation layer are controlled by forming staggered sub-retaining walls, thereby reducing the number of edge retaining walls of the display panel and reducing the size of the edge area of the display panel to increase a screen occupation ratio.

Above are embodiments of the present invention, which does not limit the scope of the present invention. Any modifications, equivalent replacements or improvements within the spirit and principles of the embodiment described above should be covered by the protected scope of the invention.

What is claimed is:

1. A display panel, comprising: a substrate, and a planarization layer, an anode layer, a pixel definition layer, a cathode layer and an encapsulation layer sequentially stacked on the substrate; wherein outside a display area of the display panel, the pixel definition layer comprises a retaining wall group disposed on the anode layer, and the retaining wall group comprises a plurality of sub-retaining walls which are spaced apart, and the retaining wall group comprises a first side close to the display area of the display panel and a second side away from the display area, wherein spaces of the plurality of the sub-retaining walls, which are spaced apart, form a path, and a length of the path is greater than a straight line distance from the first side to the second side.

2. The display panel according to claim 1, wherein the sub-retaining walls are protrusions disposed on the anode layer, and a height of the protrusions is 5 μm to 15 μm.

3. The display panel according to claim 2, wherein the anode layer is provided with a plurality of anode holes penetrating through the anode layer, and the sub-retaining walls are correspondingly disposed in the anode holes and protrudes from the anode layer, and the sub-retaining walls pass through the anode layer and are connected with the planarization layer and the cathode layer.

4. The display panel according to claim 1, wherein the sub-retaining walls comprise first sub-retaining walls and second sub-retaining walls, and the first sub-retaining walls are arranged at intervals along an extending direction perpendicular to a direction from the first side to the second side, and an interval between two first sub-retaining walls is a first space, and the second sub-retaining walls are arranged at intervals along the extending direction perpendicular to the direction from the first side to the second side, and one of the second sub-retaining walls is arranged corresponding to the interval between the two first sub-retaining walls, and a width of the sub-retaining walls is greater than or equal to a width of the first space.

5. The display panel according to claim 4, wherein the sub-retaining walls further comprise at least one third sub-retaining wall disposed close to the second side, and the third sub-retaining wall has a width greater than a sum of a width of the first sub-retaining wall and a width of the second sub-retaining wall.

6. The display panel according to claim 4, wherein the pixel definition layer comprises an edge retaining wall on a side of the retaining wall group away from the display area of the display panel, and the edge retaining wall is spaced apart from the retaining wall group.

7. The display panel according to claim 1, wherein a spacer layer is stacked on the pixel definition layer, and each of the sub-retaining walls comprises a first portion and a second portion stacked on the first portion, and the first portion is disposed in a same layer as the pixel definition layer, and the second portion is disposed in a same layer as the spacer layer.

8. The display panel according to claim 2, wherein a spacer layer is stacked on the pixel definition layer, and each of the sub-retaining walls comprises a first portion and a second portion stacked on the first portion, and the first portion is disposed in a same layer as the pixel definition layer, and the second portion is disposed in a same layer as the spacer layer.

9. The display panel according to claim 3, wherein a spacer layer is stacked on the pixel definition layer, and each of the sub-retaining walls comprises a first portion and a second portion stacked on the first portion, and the first portion is disposed in a same layer as the pixel definition layer, and the second portion is disposed in a same layer as the spacer layer.

10. The display panel according to claim 4, wherein a spacer layer is stacked on the pixel definition layer, and each of the sub-retaining walls comprises a first portion and a second portion stacked on the first portion, and the first portion is disposed in a same layer as the pixel definition layer, and the second portion is disposed in a same layer as the spacer layer.

11. The display panel according to claim 5, wherein a spacer layer is stacked on the pixel definition layer, and each of the sub-retaining walls comprises a first portion and a second portion stacked on the first portion, and the first portion is disposed in a same layer as the pixel definition layer, and the second portion is disposed in a same layer as the spacer layer.

12. The display panel according to claim 6, wherein a spacer layer is stacked on the pixel definition layer, and each of the sub-retaining walls comprises a first portion and a second portion stacked on the first portion, and the first portion is disposed in a same layer as the pixel definition layer, and the second portion is disposed in a same layer as the spacer layer.

13. A display device, comprising a display panel, wherein the display panel comprises a substrate, and a planarization layer, an anode layer, a pixel definition layer, a cathode layer and an encapsulation layer sequentially stacked on the substrate; wherein outside a display area of the display panel, the pixel definition layer comprises a retaining wall group disposed on the anode layer, and the retaining wall group comprises a plurality of sub-retaining walls which are spaced apart, and the retaining wall group comprises a first side close to the display area of the display panel and a second side away from the display area, wherein spaces of the plurality of the sub-retaining walls, which are spaced apart, form a path, and a length of the path is greater than a straight line distance from the first side to the second side.

14. The display device according to claim 13, wherein the sub-retaining walls are protrusions disposed on the anode layer, and a height of the protrusions is 5 μm to 15 μm.

15. The display device according to claim 14, wherein the anode layer is provided with a plurality of anode holes penetrating through the anode layer, and the sub-retaining walls are correspondingly disposed in the anode holes and protrudes from the anode layer, and the sub-retaining walls pass through the anode layer and are connected with the planarization layer and the cathode layer.

16. The display device according to claim 13, wherein the sub-retaining walls comprise first sub-retaining walls and second sub-retaining walls, and the first sub-retaining walls are arranged at intervals along an extending direction perpendicular to a direction from the first side to the second side, and an interval between two first sub-retaining walls is a first space, and the second sub-retaining walls are arranged at intervals along the extending direction perpendicular to the direction from the first side to the second side, and one of the second sub-retaining walls is arranged corresponding to the interval between the two first sub-retaining walls, and a width of the sub-retaining walls is greater than or equal to a width of the first space.

17. The display device according to claim 16, wherein the sub-retaining walls further comprise at least one third sub-retaining wall disposed close to the second side, and the third sub-retaining wall has a width greater than a sum of a width of the first sub-retaining wall and a width of the second sub-retaining wall.

18. The display device according to claim 16, wherein the pixel definition layer comprises an edge retaining wall on a side of the retaining wall group away from the display area of the display panel, and the edge retaining wall is spaced apart from the retaining wall group.

\* \* \* \* \*